United States Patent
Hurrell et al.

(10) Patent No.: US 7,701,256 B2
(45) Date of Patent: Apr. 20, 2010

(54) SIGNAL CONDITIONING CIRCUIT, A COMPARATOR INCLUDING SUCH A CONDITIONING CIRCUIT AND A SUCCESSIVE APPROXIMATION CONVERTER INCLUDING SUCH A CIRCUIT

(75) Inventors: Christopher Peter Hurrell, Cookham (GB); Colin Gerard Lyden, Baltimore (IE)

(73) Assignee: Analog Devices, Inc., Norwood, MA (US)

( * ) Notice: Subject to any disclaimer, the term of this patent is extended or adjusted under 35 U.S.C. 154(b) by 2 days.

(21) Appl. No.: 11/901,304

(22) Filed: Sep. 17, 2007

(65) Prior Publication Data

US 2008/0079474 A1    Apr. 3, 2008

Related U.S. Application Data

(60) Provisional application No. 60/848,512, filed on Sep. 29, 2006.

(51) Int. Cl.
*G01R 19/00* (2006.01)
*G11C 7/00* (2006.01)
*H03F 3/45* (2006.01)

(52) U.S. Cl. .............. 327/52; 327/54; 327/336; 327/345

(58) Field of Classification Search ............ 327/52, 327/54, 336, 345
See application file for complete search history.

(56) References Cited

U.S. PATENT DOCUMENTS

| | | | |
|---|---|---|---|
| 4,814,714 A * | 3/1989 | Beadle | 327/339 |
| 5,406,135 A * | 4/1995 | Kasai et al. | 327/108 |
| 6,825,696 B2 * | 11/2004 | Casper et al. | 327/55 |
| 2006/0125533 A1* | 6/2006 | Kim et al. | 327/112 |
| 2007/0115031 A1* | 5/2007 | Hsu et al. | 327/52 |

* cited by examiner

*Primary Examiner*—Lincoln Donovan
*Assistant Examiner*—John W Poos
(74) *Attorney, Agent, or Firm*—Kenyon & Kenyon LLP

(57) ABSTRACT

A signal conditioning circuit for a latching comparator comprising first and second transistors arranged in a long tail pair, the long tail pair having an active load and configured to act as an integrator.

24 Claims, 9 Drawing Sheets

Note gm 5, 6 = gm 3, 4

Note gm 5, 6 = gm 3, 4

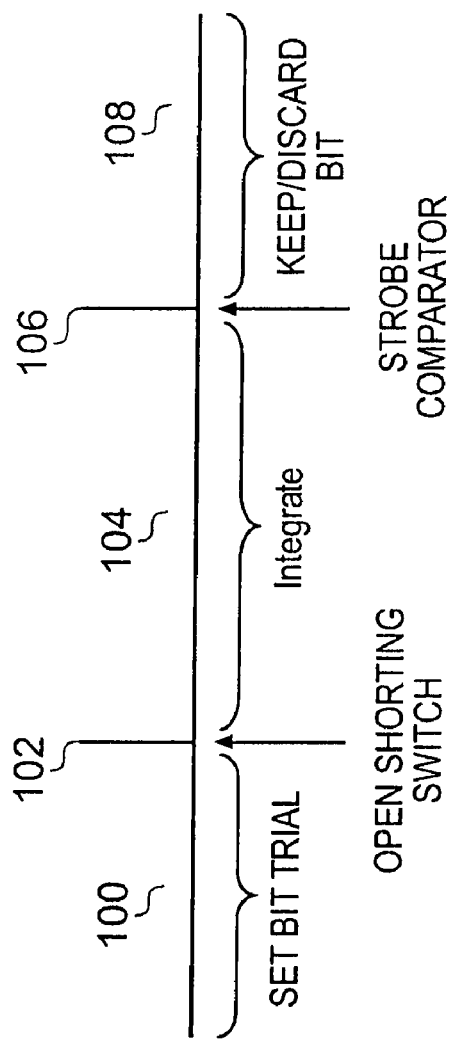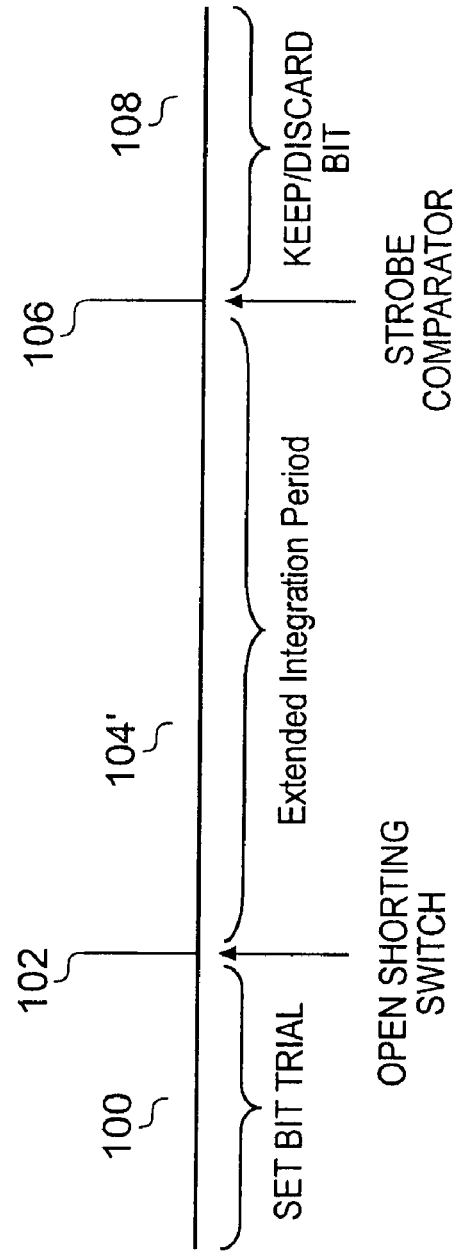

SIGNAL CONDITIONING CIRCUIT, A COMPARATOR INCLUDING SUCH A CONDITIONING CIRCUIT AND A SUCCESSIVE APPROXIMATION CONVERTER INCLUDING SUCH A CIRCUIT

FIELD OF THE INVENTION

The present invention relates to a signal conditioning circuit which is suitable for use in a successive approximation converter, the circuit operating to condition a signal for supply to a comparator latch used within the successive approximation converter.

BACKGROUND OF THE INVENTION

In a successive approximation routine, SAR, converter a comparator is used to determine the difference between a trial value and the analog value being converted. It is known in prior art successive approximation converters for the comparator to be formed from a number of voltage amplifier stages followed by a regenerative latch. The latch is a real component and hence suffers from both thermal noise and an input offset. The purpose of the amplifier stages is to reduce the effect of thermal noise and the offset by amplifying the voltage difference prior to it being provided to the latch. The amplifiers also have the effect of reducing "kickback" from the latch that can cause voltage spikes at the comparator inputs and which then have to be given time to settle out.

FIG. 1 is a circuit diagram of a voltage amplifier used in the prior art. The circuit comprises first and second field effect transistors Q1 and Q2 having their sources connected to a current source 10 which can also be conveniently be formed as a field effect transistor. A gate 12 of the first transistor Q1 acts as the non-inverting input to the amplifier, whereas a gate 14 of the second transistor Q2 acts as the inverting input. The drain terminal of transistor Q1 is connected to a second voltage supply rail labelled supply 2 via a resistor 16, and similarly the drain of the second transistor Q2 is connected to the second supply rail via a resistor 18. A connection to the drain of the first transistor Q1 also functions as the negative output, "on" of the amplifier, whereas a corresponding connection to the drain of the second transistor Q2 functions as the positive output, "op". The transistors Q1 and Q2 are matched and hence can be regarded as having a first transconductance $gm(1, 2)$ and consequently the gain of the amplifier is $gm(1, 2)$ multiplied by the load resistance R.

The outputs "on" and "op" are connected to either a subsequent amplifier stage or to the comparator latch. The outputs therefore have to drive both the inherent capacitance of the following stage, such as the gate capacitance of a subsequent field effect transistor, and also have to drive the parasitic capacitances associated with the load and devices connected to the output nodes. The combination of the resistors 16 and 18 and the parasitic capacitance $C_P$ creates a pole, giving the circuit an overall low-pass frequency response.

It is also known to replace the load resistors 16 and 18 by active loads as shown in FIG. 2. In FIG. 2 a third transistor Q3, which is an NMOS device, has its drain connected to the drain of Q1 and its source connected to supply 2. The gate of the third transistor Q3 is connected to the drain of the third transistor Q3 such that the third transistor Q3 is in a diode connected configuration. A fourth transistor Q4 is similarly connected with respect to the second transistor Q2 so as to replace the second resistor 18. In addition a fifth transistor Q5 has its drain connected to the drain of the second transistor Q2 and its source connected to supply 2. However the gate of transistor Q5 is connected to the gate of transistor Q3. A sixth transistor Q6 is similarly connected, with its gate being connected to the gate of Q4 but its drain being connected to the drain of Q1. The transistors are matched such that transistors Q3 and Q4 have the same transconductance and transistors Q5 and Q6 have the same transconductance, but which may be different to that of transistors Q3 and Q4. In this arrangement the gain of the amplifier is $gm(1, 2) \div (gm(3, 4) - gm(5, 6))$. It is known to make the transconductance of the fifth and sixth transistors less than that of the third and fourth transistors to avoid the gain being too large.

It should be noted that making the gain larger has the effect of reducing the bandwidth of the amplifier (because the product of gain and bandwidth is generally a constant). In one respect this is desirable as it reduces a noise bandwidth of the circuit, however it also increases a settling time. As a result although the influence of noise would be reduced, the converter bit trials would have to run more slowly to allow the circuit to settle to full accuracy. As a result, amplifier stages have typically been made with gains of between 10 and 20.

SUMMARY OF THE INVENTION

According to a first aspect of the present invention there is provided a signal conditioning circuit for a latching comparator, the circuit comprising first and second transistors arranged in a long tail pair, the long tail pair having an active load and configured to act as an integrator.

According to a second aspect of the present invention there is provided a successive approximation converter including a signal conditioning circuit comprising first and second transistors arranged in a long tail pair, the long tail pair having an active load and configured to act as an integrator.

According to a third aspect of the present invention there is provided a comparator, comprising a clocked latch preceded by at least one integrator.

BRIEF DESCRIPTION OF THE DRAWINGS

The present invention will further be described, by way of non-limiting example, with reference to the accompanying drawings in which:

FIG. 10 is an exemplary timing diagram of a bit trial;

FIG. 11 is a timing diagram for a bit trial having an extended integration period.

DESCRIPTION OF PREFERRED EMBODIMENTS OF THE INVENTION

Figure 2:
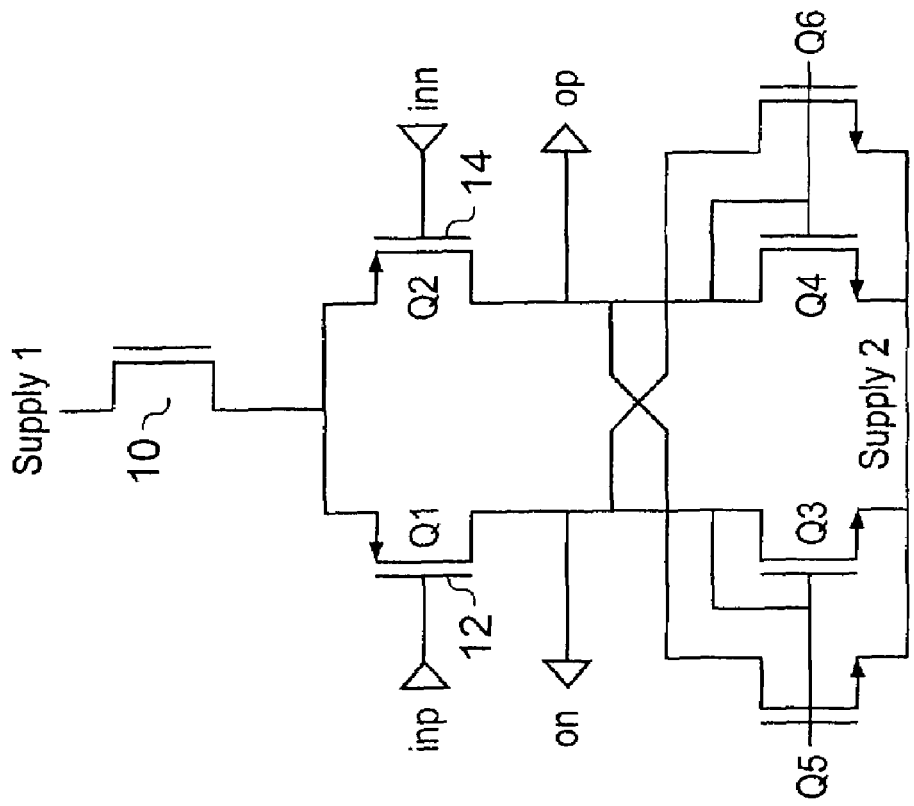
FIG. 2 illustrates a modification to the amplifier of FIG. 1 where the load resistors are replaced by active devices.
Figure 3:
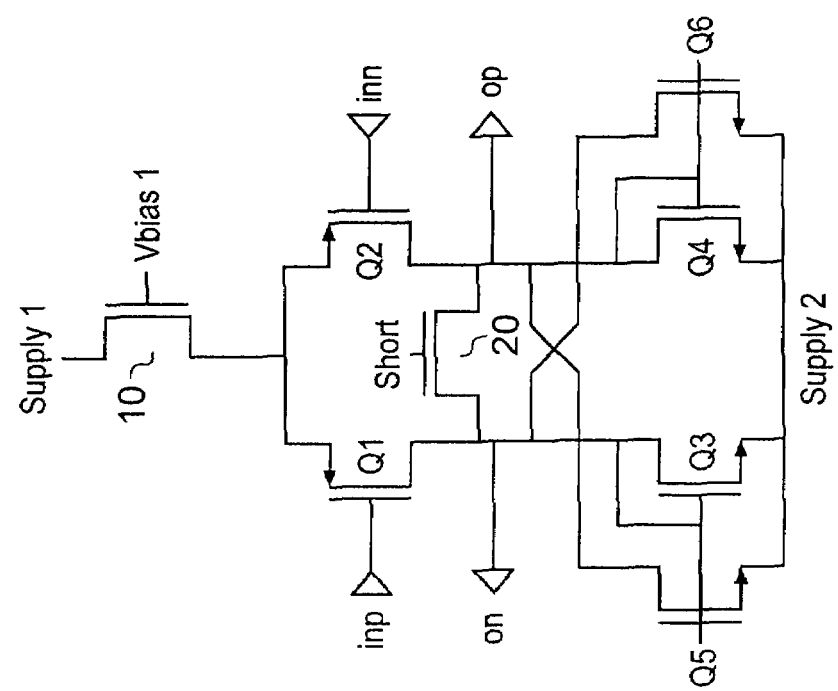
FIG. 3 schematically illustrates a signal conditioning circuit constituting an embodiment of the present invention.

FIG. 3 schematically illustrates a signal conditioning circuit constituting an embodiment of the present invention. Like reference numerals will be used to designate like parts. Therefore, comparing FIG. 3 with FIG. 2 it should be noted that the transconductance of the third to sixth transistors have all been set to the same value and that an additional electrically controlled switch 20 has been fabricated so as to selectively connect the output nodes "on" and "op" together in response to a shorting signal, labelled "short".

Figure 1:
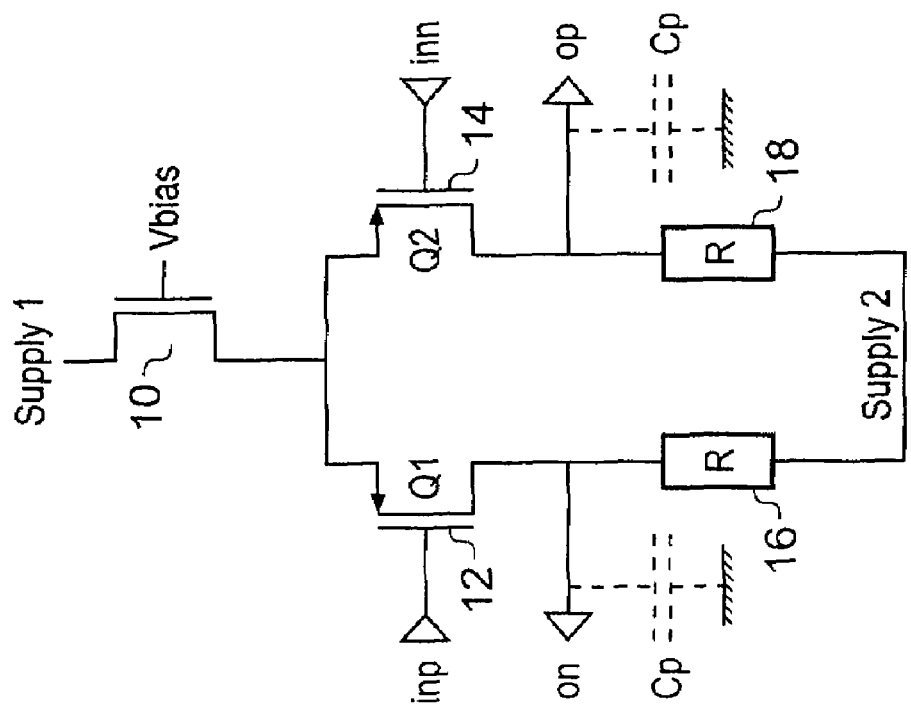
FIG. 1 schematically illustrates a single amplifier stage used to amplify a difference between first and second signals before providing it to a comparator.

When progressing from one bit trial to another, the parasitic capacitances $C_P$ at the output "on" and "op" of the signal conditioning circuit may need to transition from the value appropriate for the last bit trial to the value appropriate for the current bit trial. This may require a full scale change in the voltage stored across the parasitic capacitances $C_P$. Given that the charge and discharge current in the prior art arrangements of FIGS. 1 and 2 are limited by the current supplied by the constant current source 10 then the initial rate of charge or discharge is slew rate limited as a function of the current from the current source and the value of the parasitic capacitance. This rate of change further becomes reduced as a voltage starts to build across the capacitor, and once again follows the characteristic shape of a RC time constant. The provision of the shorting switch 20 enables the capacitors to be rapidly discharged via a low impedance route effectively only involving the parasitic capacitors and the shorting switch 20 such that only the subsequent charging of the capacitors becomes slew rate limited. In use, the shorting switch 20 is closed while the digital to analog converter is settling to a new trial value, and once the digital to analog converter preceding the signal conditioning circuit has settled then the shorting switch 20 is opened. Thus recovery from the previous bit trial is much improved.

Given that the provision of the shorting switch solves the settling problem, the inventors realised that it was also possible to increase the gain of the stage without incurring undesirable effects. In fact, the inventors realised that the comparator or latch preamplifier could be replaced by an integrator. If the circuit is acting as an integrator, then for a small differential DC input between the gates of the transistors Q1 and Q2 then the output voltage difference between "on" and "op" would rise linearly with respect to time and, if there were no head room constraints on the supply rails, would continue rising indefinitely. This contrasts with the operation of an amplifier where the output voltage would ramp up following a classic "RC" time constant characteristic to an ultimate value represented by $A \times V_{DIFF}$, where A represents the amplifier gain and $V_{DIFF}$ represents the voltage difference between the input voltages supplied to the gates of Q1 and Q2.

By making the transconductance of Q3, Q4, Q5 and Q6 the same then the theoretical gain of the circuit would, if the drain-source impedance is ignored, exhibit infinite DC gain and would approximate the integrator functionality.

The circuit of FIG. 3 operates in conjunction with the parasitic and load capacitances $C_P$ to form an integrator. Thus the difference between the voltages at "op" and "on" changes substantially linearly. By changing the preamplifier from a voltage gain amplifier into an integrator, the "gain" of the pre-amplifier stage is maximised. Furthermore, as will be shown later, the magnitude of offsets and noise in any subsequent stage referred to the input of this stage is reduced. Also, noise created by the devices within the integrator is averaged, thereby reducing the magnitude of this noise when referred to the input of this signal conditioning circuit.

Figure 4:
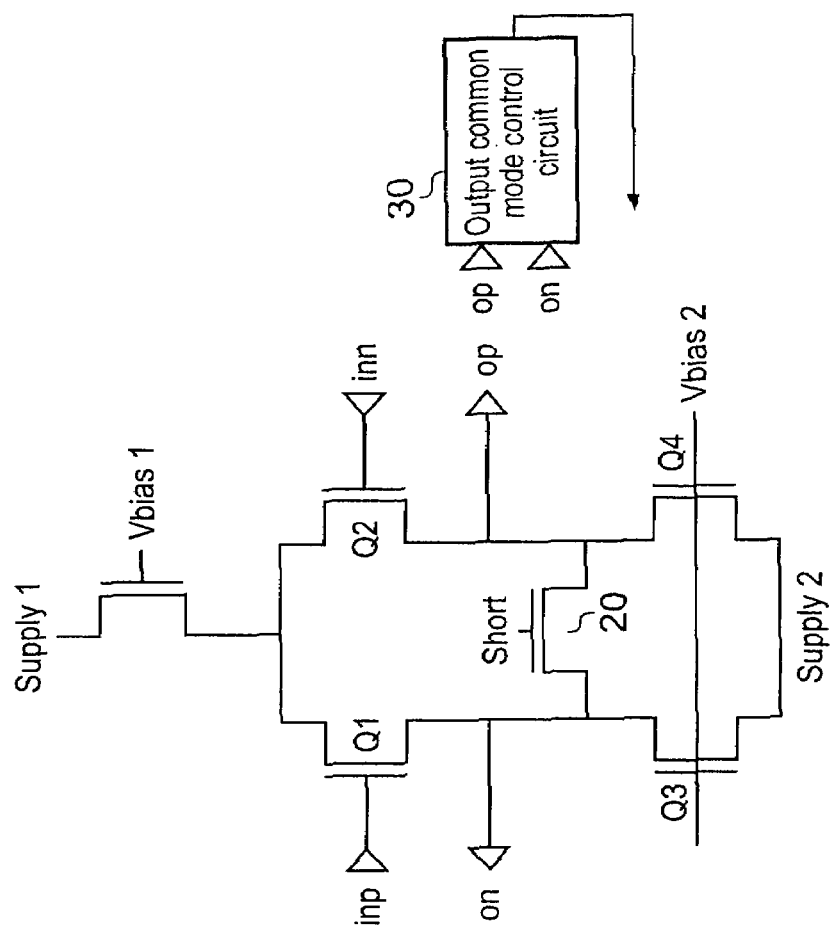
FIG. 4 schematically illustrates a signal conditioning circuit constituting a second embodiment of the present invention.

FIG. 4 schematically illustrates an alternative embodiment of the invention where the third and fourth transistors Q3 and Q4 are supplied with a fixed common bias voltage $V_{bias2}$ at their gates so that they act as current sinks. With this arrangement the transistors Q3 and Q4 do not control the output common mode voltage and it may therefore be necessary to have a output common mode control circuit 30 to monitor the common mode voltage at the output of the stage and to provide a correction signal to bring the common mode voltage back to a wanted value.

Figure 5:
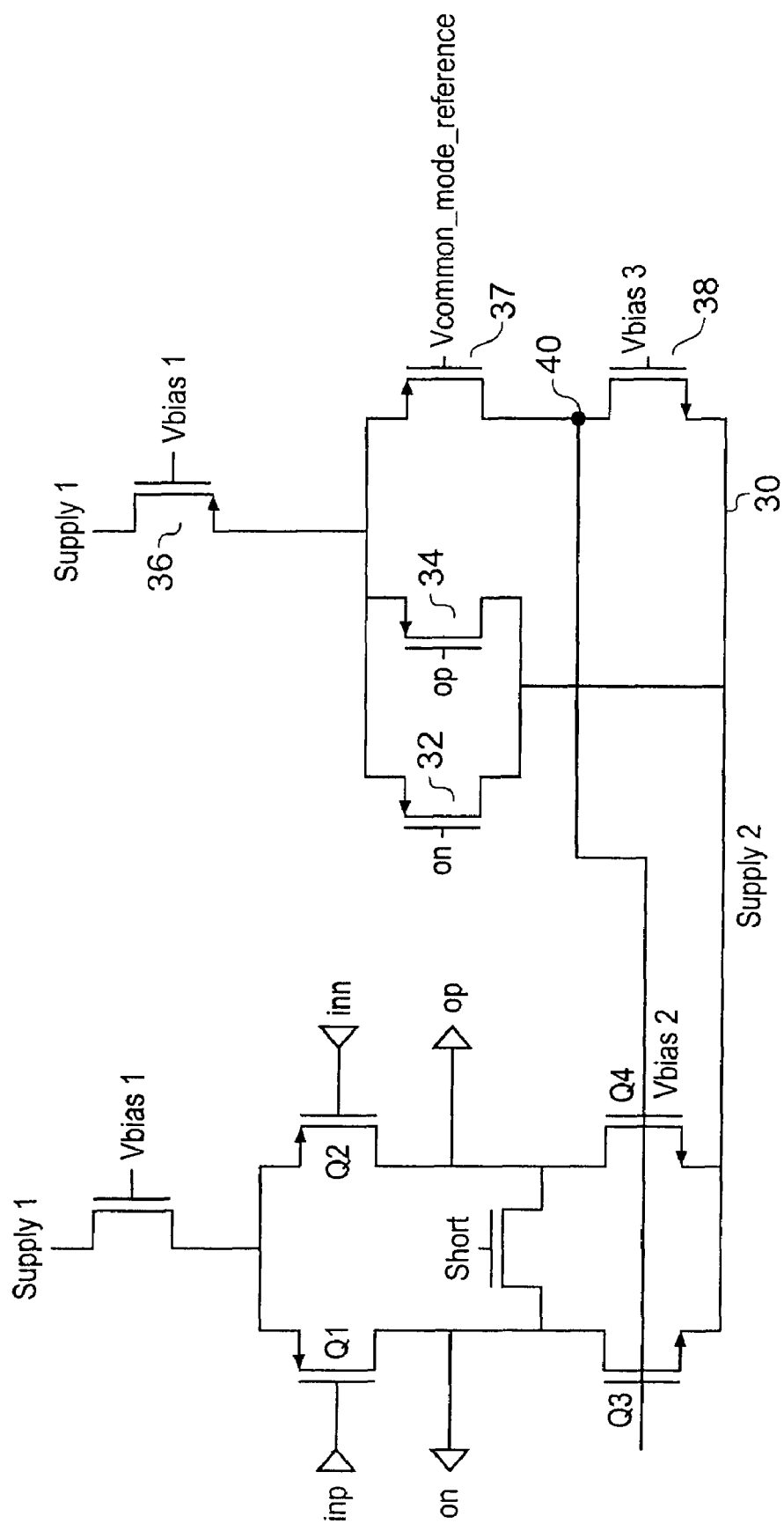
FIG. 5 illustrates the circuit of FIG. 4 in greater detail, and in particular shows the configuration of the common mode control circuit.
Figure 6:
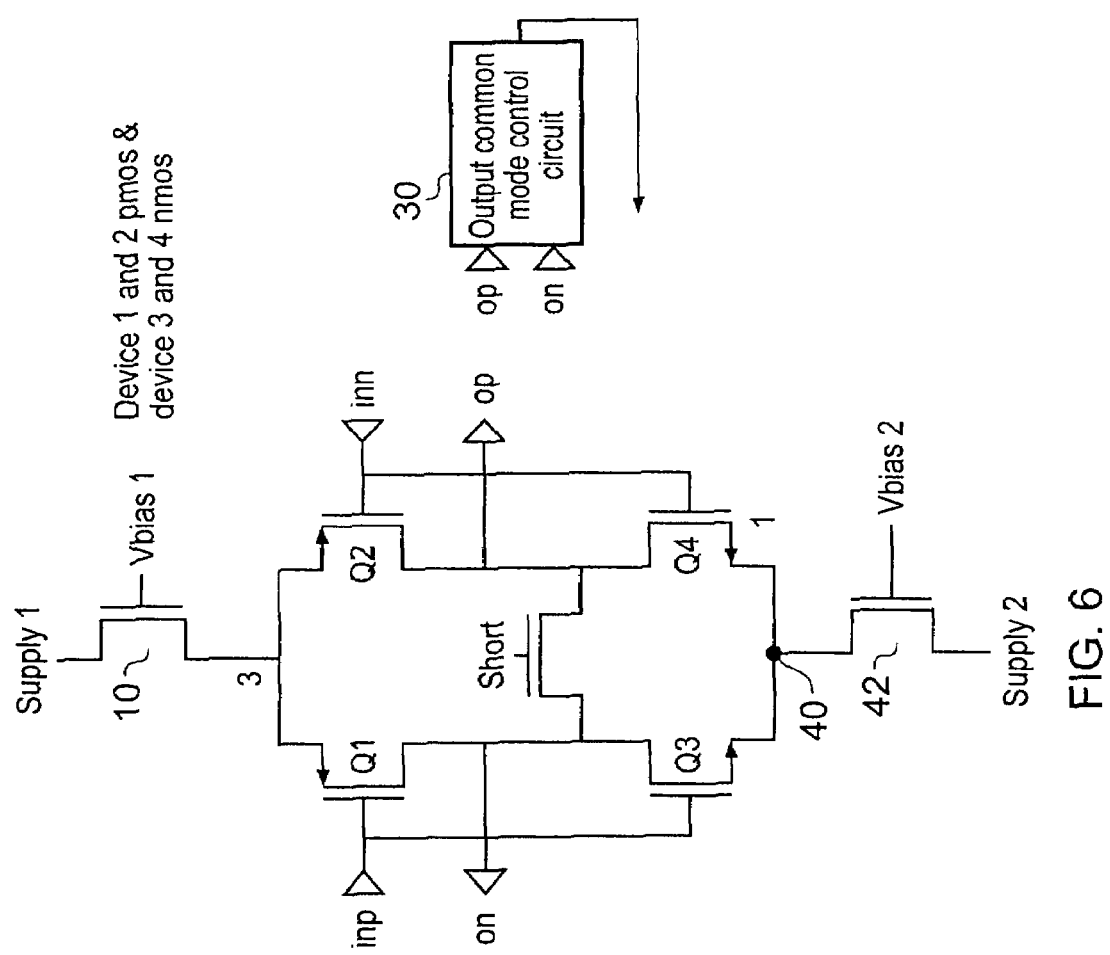
FIG. 6 is a circuit diagram illustrating a signal conditioning circuit constituting a third embodiment of the present invention.

FIG. 5 illustrates the arrangement of FIG. 4 in more detail, and includes one embodiment of a common mode output control circuit 30. In this arrangement transistor 32 is provided in parallel with a further transistor 34 with the gate of transistor 32 being connected to the inverting output "on" of the signal conditioning circuit and the gate of transistor 34 being connected to the non-inverting output "op" of the signal conditioning circuit. These transistors each provide current flow paths from a constant current source 36 to "supply 2". A further transistor 37 has its source connected to the sources of transistors 32 and 34 so that it also receives current from the current source 36. The drain of transistor 37 is connected to a drain of a further transistor 38 whose source is connected to supply 2, and whose gate is supplied with a further bias voltage, $V_{bias3}$. A node 40 formed by the connection between transistors 36 and 38 forms a bias output node for providing the bias voltage $V_{bias2}$ to transistors Q3 and Q4. It can be seen, that in use, the common mode voltage on the outputs is compared with the common mode reference voltage supplied to transistor 37. If we assume that the common mode voltage is too high, then transistors 32 and 34 start to switch off and hence more current is conducted via transistor 36. This in turn causes the voltage at node 40 to increase thereby causing transistors Q3 and Q4 to conduct more. This in turn causes the common node voltage at the outputs "on" and "op" to reduce FIG. 6 shows a further modification where the gate connections of transistors Q3 and Q4 are now modified such that the gate of Q3 is connected to the gate of Q1 and that the gate of Q4 is connected to the gate of Q2. Furthermore the common node 40 formed by the connection of the source of Q3 to the source of Q4 is now connected to "supply 2" via a further transistor 42 which receives a control output from the output common mode control circuit 30 so as to act as a variable current sink. The benefit of this embodiment is that by using both the NMOS and PMOS devices the transconductance of the stage is increased without requiring any additional bias current.

Figure 7:
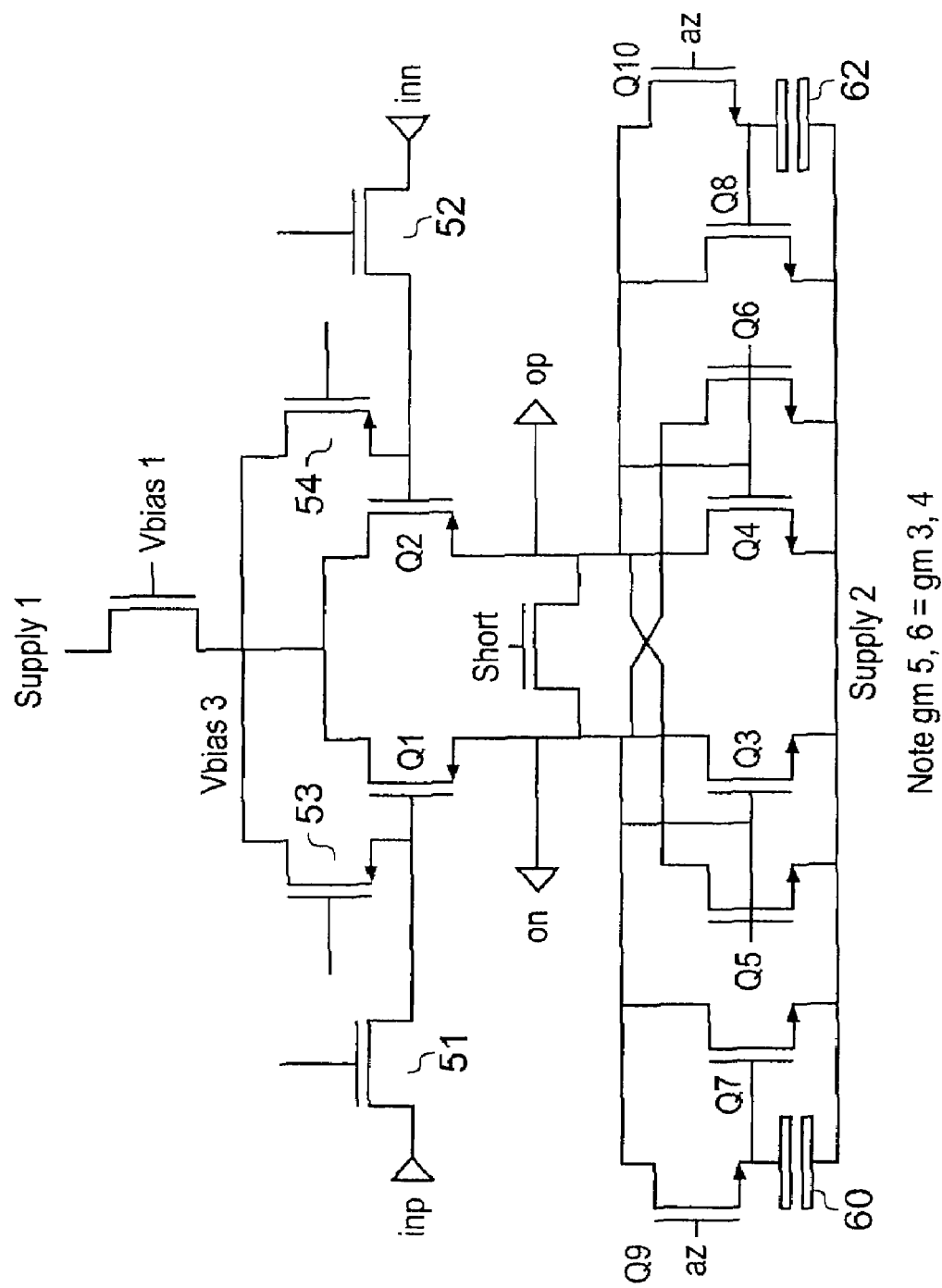
FIG. 7 illustrates a modification to the circuit of FIG. 3 so as to include components for reducing offset.
Figure 8:
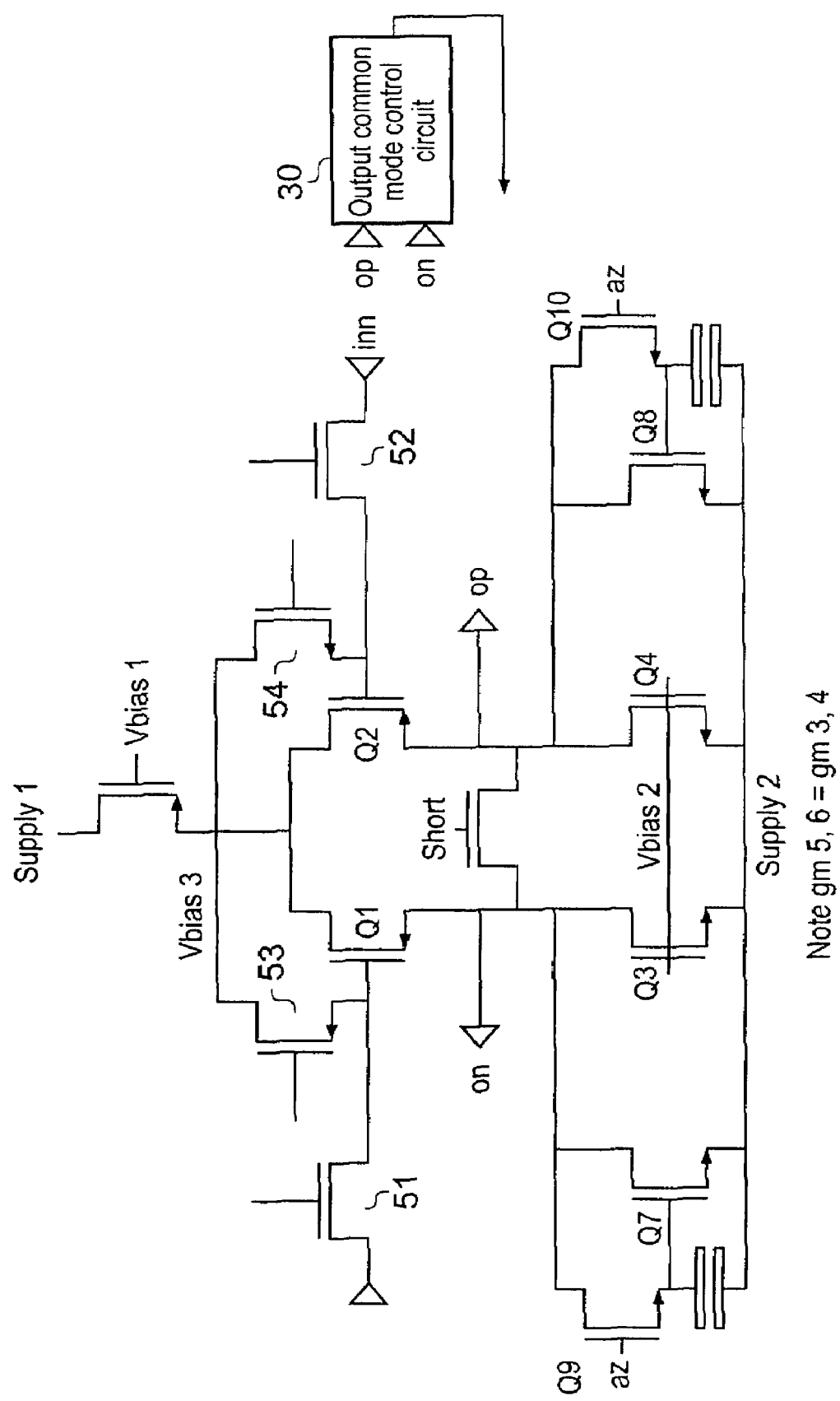
FIG. 8 schematically illustrates a modification to the circuit shown in FIGS. 4 and 5 once again including components for reducing offset.

FIG. 7 and FIG. 8 represent modifications to the circuits as shown in FIGS. 3 and 4, respectively, so as to include auto-zeroing components. For simplicity only the arrangement shown in FIG. 7 will be described in detail. The auto-zeroing components can be regarded as occurring in two parts. Firstly an input section is provided which allows the same voltage to be applied to the gates of the first and second transistors Q1 and Q2. In order to achieve this, Q1 and Q2 are associated with a further four switches 51, 52, 53 and 54 which are conveniently implemented, as shown in FIG. 7, as field effect transistors. Switches 51 and 52 can be used to selectively connect and isolate the gates of transistors Q1 and Q2 from the inputs "inn" and "inp" of the circuit. Thus, when it is desired to perform an auto-zero operation, transistors 51 and 52 are switched into a non-conducting state. Once this has been achieved transistors 53 and 54 are switched into a conducting state such that a further bias voltage, $V_{bias3}$ is applied to the gates of both Q1 and Q2.

A second part of the auto-zeroing circuit occurs around the active load. As in the embodiment of FIG. 3, transistors Q3, Q4, Q5 and Q6 are nominally matched and have identical or similar transconductance. As a consequence the net impedance of these components is very high. It can be seen that Q7 is provided such that its drain is connected to the output node "on" and its source is connected to "supply 2". If Q7 has a transconductance gm7, then when Q7 is switched into a diode connecting state then the gain of the circuit becomes $$\frac{gm1}{gm7}.$$

If the transconductance of Q7 is similar to that of Q1 then the gain of the circuit falls to unity when Q7 is conducting in this diode connected manner, and this can be achieved by using a further transistor Q9 to provide a low impedance path between the drain and the gate of Q7 during the auto-zero phase. A capacitor 60 is provided to sample and store the gate voltage of Q7, depending on whether the further transistor Q9 is in a conducting state (sample) or non-conducting (store). A corresponding arrangement involving transistors Q8, Q10 and a further capacitor 62 are formed in the other half of the circuit.

In order to understand the operation of the circuit, suppose that transistors 51 and 52 are placed in a high impedance state and that transistors 53 and 54 are switched to a low impedance state such that the same voltage is applied to the gates of Q1 and Q2. If the circuit was perfectly matched then the voltages at "on" and "op" would be identical. However suppose that there is a slight offset between Q1 and Q2, and that this offset is represented by $V_{OFF}$. When Q9 and Q10 are non-conducting, then the load for Q1 and Q2 is formed solely by transistors Q3, Q4, Q5 and Q6 and hence the gain of the stage is large and theoretically approaching infinity. For convenience, it is easier to assume that the gain is finite but large. Therefore suppose that the gain of the circuit is 1000. Therefore the output offset voltage $VOUT_{OFF}$ would be $1000V_{OFF}$. However, suppose now that transistors Q9 and Q10 are operated as switches thereby causing the transistors Q7 and Q8 to become the predominant load for transistors Q1 and Q2 thereby reducing the gain of the circuit to close to unity. If we assume for convenience that the gain is reduced to unity then the output offset $VOUT_{OFF}$ becomes reduced to that of the input offset $V_{OFF}$. The capacitors 60 and 62 charge to the gate voltages of transistors Q7 and Q8 in order to achieve this condition. Suppose now that transistors Q9 and Q10 are switched into a non-conducting state. The output voltage offset immediately subsequent to switching of transistors Q9 and Q10 off is identical to that which occurred immediately prior to switching the transistors off, but the gain of the circuit increased from around unity to around 1000 times. It can therefore be seen that the input referenced offset has effectively been reduced by a factor of 1000 as transistors Q7 and Q8 become driven by a constant gate voltage and therefore effectively form an infinite impedance load similar to that formed by the combination of transistors Q3 to Q6 in the circuit described with respect to FIG. 3. Once the output offset has been captured in this way, switches 53 and 54 can be opened and switches 51 and 52 closed in order to allow the bit trials to commence.

It should be noted that for any of the circuit arrangements described herein, cascode devices may also be used to further increase the effective gain of the stage and also to decrease parasitic capacitance on the output node. These cascode devices may be placed between the output nodes and the input devices Q1 and Q2, or the output nodes and the load devices Q3, Q4, Q5, Q6, Q7 and Q8. Similarly cascode devices could be inserted into the arrangement shown in FIG. 3. Such a modification is shown in FIG. 11 where cascode devices Q11 and Q12 have been included.

As noted before, the reason why the stages act as integrators is that there is always an unwanted parasitic capacitance at the output of the integrator. In preferred embodiments of the invention no instantiated capacitor is used and use is made of the inherent parasitic capacitance of the circuit. In fact it is desirable to make the parasitic capacitance at the output of the integrator as small as possible in order to maximise the effective gain or rate of integration of the stage.

The auto-zero arrangement in FIG. 8 could be seen to comprise exactly the same components as described with respect to FIG. 7, and to work in the same way.

Figure 9:
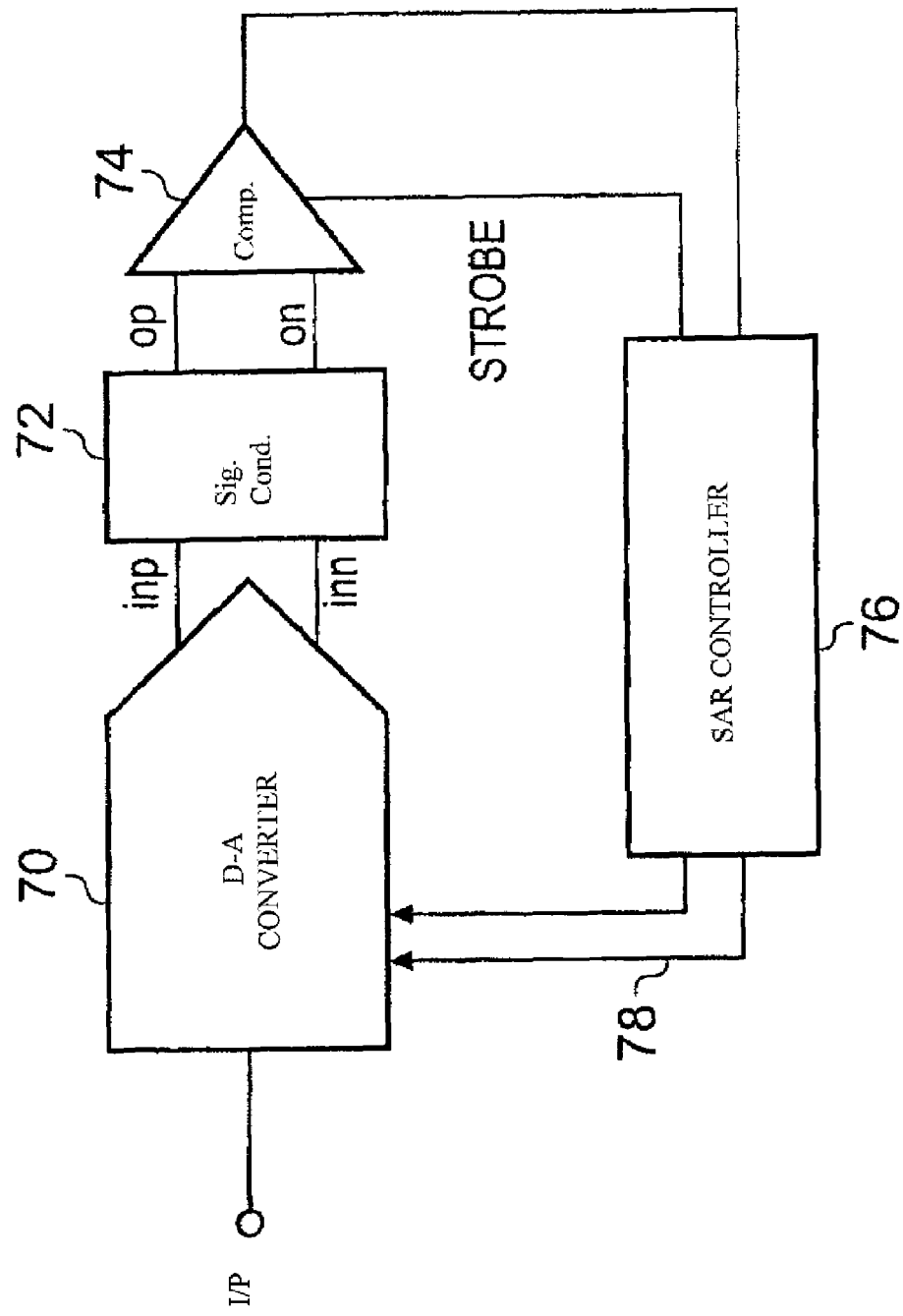
FIG. 9 schematically illustrates a SAR converter including a signal conditioning circuit constituting an embodiment of the present invention.
Figure 12:
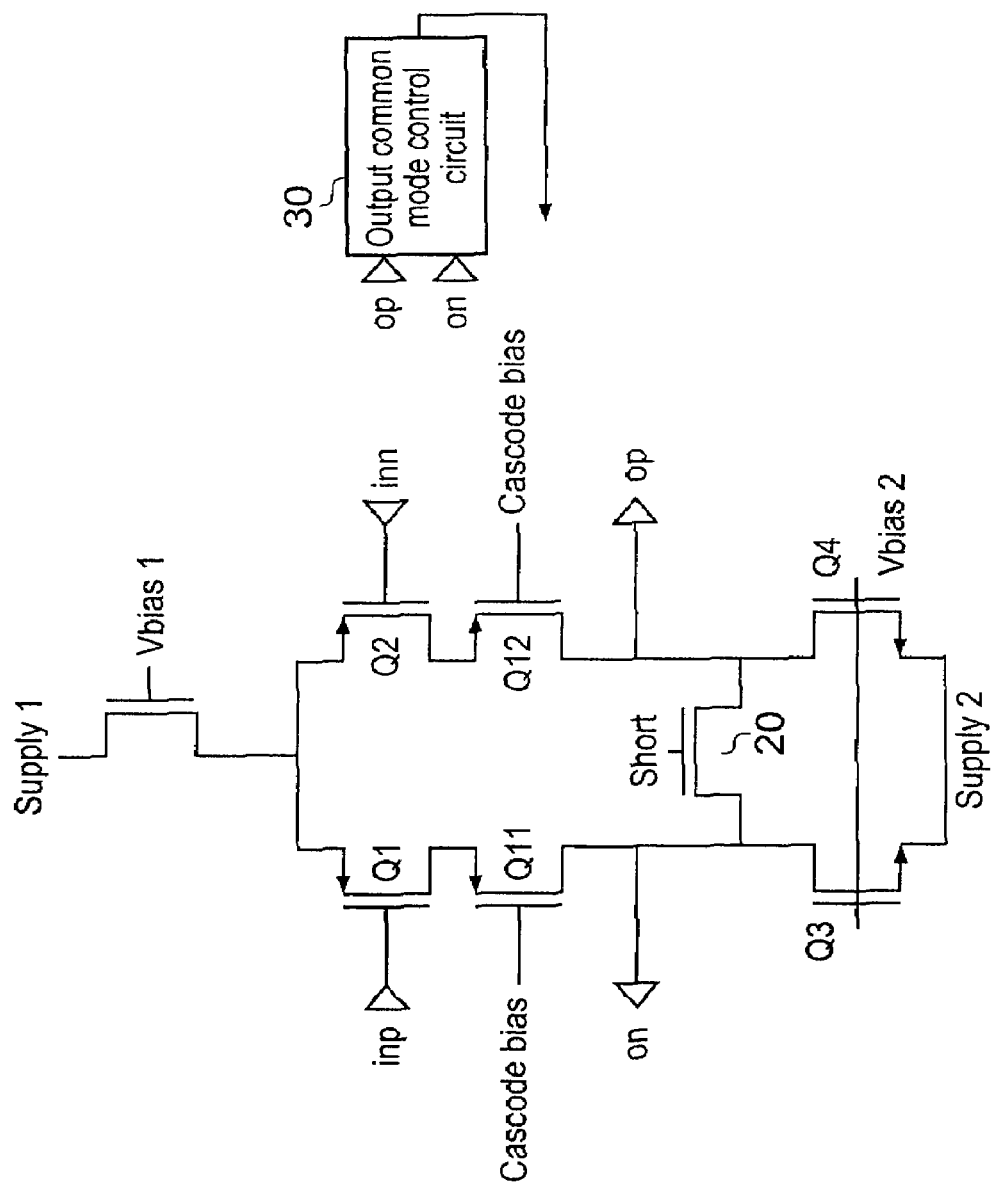
FIG. 12 shows a modification to the circuit shown in FIG. 4 so as to include cascode transistors.

FIG. 9 schematically illustrates the internal architecture of a successive approximation converter including a signal conditioning circuit.

The converter includes a digital to analog converter 70 for generating a trial value. The digital to analog converter 70 may be implemented using several technologies, however switched capacitor arrays are particularly well suited as they can also be used to sample the input signal. The switched capacitor array may be implemented in a dual ended fashion, as is well known to the person skilled in the art. In the example shown in FIG. 9 the digital to analog converter 70 has positive and negative outputs which are connected to the input "inp" and "inn" of a conditioning circuit 72, for example as shown in any of FIGS. 3 to 8. The outputs of the signal conditioning circuit 72 are provided to a comparator 74 which makes a determination of the relative sizes of the signal provided by a SAR controller. The comparator 74 provides the result of the comparison to the controller 76 which then decides whether to keep or reject the bit being trailed in the conversion process.

The signal conditioning circuit can be regarded as being internal to the strobed or clocked comparator. The comparator could be implemented merely as a clocked latch receiving its output from the integrating signal conditioning circuit.

In use, and with reference to FIG. 10, the bit trial is set up in a first part 100 of a bit trial cycle. Once sufficient time has elapsed for the trial voltages to become sufficiently settled the shorting switch 20 is opened at time 102. The signal conditioning circuit then integrates the signal at its input for an integration time 104 until the comparator is strobed at time 106. The output of the comparator is then provided to the controller which decides whether to keep or reject the bit at time 108.

In a SAR cycle some of the bit trials may benefit from an extended integration period 104' as shown in FIG. 11. This extended integration period reduces the offset of noise and could be performed during the last few bit trials of a successive approximation routine.

The invention claimed is:

1. A signal conditioning circuit for a latching comparator, the circuit comprising first and second transistors in which the first and second transistors are field effect transistors each having a drain, a source and a gate, and the sources of the first and second transistors are connected to one of a current source and a current sink, and the drain of each of the first and second transistors is connected, either directly or via at least one cascode device, to an active load, and to a first or second output node, respectively, and the active loads comprise respective third and fourth transistors, the third transistor being in series connection between the first output node and a common node, and the fourth transistor being in series connection between the second output node and the common node, and the third and fourth transistors are in a diode connected configuration and a further transistor is arranged to be operable to provide a low impedance path between the first and second output nodes, and the signal conditioning circuit is configured to act as an integrator, and where a rate of change of voltage at the output nodes in response to a fixed voltage difference between the gates of the first and second transistors is substantially constant from when the further transistor is opened until a latching comparator responsive to the signal conditioning circuit is strobed.

2. A signal conditioning circuit as claimed in claim 1, in which the further transistor is a shorting transistor connected between the first and second output nodes.

3. A successive approximation converter including a signal conditioning circuit as claimed in claim 1.

4. A comparator, comprising a clocked latch preceded by a signal conditioning circuit as claimed in claim 1, where the signal conditioning circuit further comprises switches for placing the signal conditioning circuit in a low gain amplifier mode for performing an offset reduction.

5. A comparator as claimed in claim 4, wherein an integration period is extended for one or more of the least significant bits in a successive approximation conversion.

6. A comparator as claimed in claim 4, where an integration period is extended for a critical decision.

7. A signal conditioning circuit as claimed in claim 1, further including an input arrangement for connecting inputs of the first and second transistors to the same voltage as one another.

8. A signal conditioning circuit for a latching comparator, the circuit comprising first and second transistors in which the first and second transistors are field effect transistors each having a drain, a source and a gate, and the sources of the first and second transistors are connected to one of a current source and a current sink, and the drain of each of the first and second transistors is connected, either directly or via at least one cascode device, to an active load, and to a first or second output node, respectively, and the active loads comprise respective third and fourth transistors, the third transistor being in series connection between the first output node and a common node, and the fourth transistor being in series connection between the second output node and the common node, and the third and fourth transistors are in a diode connected configuration and a further transistor is arranged to be operable to provide a low impedance path between the first and second output nodes, and the signal conditioning circuit is configured to act as an integrator, further comprising fifth and sixth transistors, and where the fifth transistor is in series connection between the second output node and the common node, and a control terminal of the fifth transistor is connected to the control terminal of the third transistor; and the sixth transistor is in series connection between the first output node and the common node, and a control terminal of the sixth transistor is connected to the control terminal of the fourth transistor, and in which the third to sixth transistors are field effect transistors, and a transconductance of the third, fourth, fifth and sixth transistors is substantially the same.

9. A signal conditioning circuit as claimed in claim 8, further including seventh and eighth transistors, connected between the first and second output nodes and the common node, respectively, such that when the seventh and eighth transistors are in a diode connected configuration the circuit operates as an amplifier having a low gain mode.

10. A signal conditioning circuit as claimed in claim 9, further including capacitors for sampling and holding control voltages for the seventh and eighth transistors, respectively.

11. A signal conditioning circuit as claimed in claim 9, further including a ninth transistor operable to place the seventh transistor in a diode connected configuration, and a tenth transistor operable to place the eighth transistor in a diode connected configuration.

12. A signal conditioning circuit for a latching comparator, the circuit comprising first and second transistors wherein the first and second transistors are field effect transistors each having a drain, a source and a gate, and the sources of the first and second transistors are connected to a current source, and the drain of each of the first and second transistors is connected, either directly or via at least one cascode device, to an active load, and to a respective first or second output node, and in which each active load comprises a respective third or fourth transistor, the third transistor being in series connection between the first output node and a common node, and the fourth transistor in series connection between the second output node and the common node, and wherein the third and fourth transistors are field effect transistors, and a gate of the third transistor is connected to a gate of the first transistor; and a gate of the fourth transistor is connected to the gate of the second transistor; the common node is connected to a current sink; and the first and second transistors are P-type devices and the third and fourth transistors are N type devices and a further transistor is arranged to be operable to provide a low impedance path between the first and second output nodes.

13. A signal conditioning circuit as claimed in claim 12, in which a common mode control circuit is arranged to monitor a common mode voltage at the first and second output nodes, and to provide a control signal to the current source or sink.

14. A signal conditioning circuit for a latching comparator, the circuit comprising first and second transistors wherein the first and second transistors are field effect transistors each having a drain, a source and a gate, and the sources of the first and second transistors are connected to one of a current source and a current sink, and the drain of each of the first and second transistors is connected, either directly or via at least one cascode device, to an active load, and to a respective first and second output node, and in which the active load comprises third and fourth transistors, the third transistor being in series connection between the first output node and a common node, and the fourth transistor being in series connection between the second output node and the common node, and further comprising fifth and sixth transistors, and where the fifth transistor is in series connection between the second output node and the common node, and a control terminal of the fifth transistor is connected to the control terminal of the third transistor; and the sixth transistor is in series connection between the first output node and the common node, and a control terminal of the sixth transistor is connected to the control terminal of the fourth transistor, and a further transistor is arranged to be operable to provide a low impedance path between the first and second output nodes, and the signal conditioning circuit is configured to act as an integrator.

15. A signal conditioning circuit for a latching comparator, the circuit comprising first and second field effect transistors each having a drain, a source and a gate, and the sources of the first and second transistors are connected to one of a current source and a current sink, and the drain of each of the first and second transistors is connected, either directly or via at least one cascode device, to a first or second output node, respectively, and a shorting transistor is connected between the first and second output nodes so as to be operable to connect the first and second output nodes together, the circuit further comprising a third transistor connected in series between the first output node and a common node and a fourth transistor in series connection between the second output node and the common node, and wherein gates of the third and fourth transistors are connected a bias voltage generator, and the signal conditioning circuit is configured to act as an integrator.

16. A signal conditioning circuit as claimed in claim 15, in which the bias voltage generator is responsive to a common mode voltage at the first and second output nodes, and adjusts the bias voltage to maintain the common mode voltage at a target value.

17. A signal conditioning circuit for a latching comparator, the circuit comprising first to fourth transistors, wherein the first and second transistors are field effect transistors each having a drain, a source and a gate, and the sources of the first and second transistors are connected to one of a current source and a current sink, and the drain of each of the first and second transistors is connected, either directly or via at least one cascode device, to a first or a second output node, respectively, and a shorting transistor is connected between the first and second output nodes so as to be operable to connect the first and second output nodes to each other, and the third transistor is in series connection between the first output node and a common node and the fourth transistor is in series connection between the second output node and the common node, and where a rate of change of voltage at the output nodes in response to a fixed voltage difference between the gates of the first and second transistors is substantially constant from when the shorting switch is opened until a latching comparator responsive to the signal conditioning circuit is strobed.

18. A comparator in combination with a signal conditioning circuit as claimed in claim 17, wherein, in use, an integration period is extended for on or more of the least significant bits in a successive approximation.

19. A comparator in combination with a signal conditioning circuit as claimed in claim 17, wherein, in use, an integration period is extended for a critical decision.

20. A signal conditioning circuit as claimed in claim 17, further including fifth and sixth transistors, connected between the first and second output nodes and the common node, respectively, such that when the fifth and sixth transistors are in a diode connected configuration the circuit operates as an amplifier having a low gain mode.

21. A signal conditioning circuit as claimed in claim 20, further including capacitors for sampling and holding control voltages for the fifth and sixth transistors, respectively.

22. A signal conditioning circuit as claimed in claim 20, further including a seventh transistor operable to place the fifth transistor in a diode connected configuration, and a eighth transistor operable to place the sixth transistor in a diode connected configuration.

23. A successive approximation converter including a signal conditioning circuit as claimed in claim 17.

24. A comparator, comprising a clocked latch preceded by a signal conditioning circuit as claimed in claim 17, where the signal conditioning circuit comprises switches for placing the signal conditioning circuit in a low gain amplifier mode for performing an offset reduction.

* * * * *